United States Patent
Daigle

(10) Patent No.: US 8,537,260 B2
(45) Date of Patent: Sep. 17, 2013

(54) APPARATUS AND METHOD FOR LOW NOISE IMAGING

(75) Inventor: Olivier Daigle, Verdun (CA)

(73) Assignee: Photon Etc, Inc., Montreal, Quebec (CA)

( * ) Notice: Subject to any disclaimer, the term of this patent is extended or adjusted under 35 U.S.C. 154(b) by 587 days.

(21) Appl. No.: 12/611,981

(22) Filed: Nov. 4, 2009

(65) Prior Publication Data

US 2010/0283882 A1 Nov. 11, 2010

Related U.S. Application Data

(60) Provisional application No. 61/176,742, filed on May 8, 2009.

(51) Int. Cl.
*H04N 5/335* (2011.01)
*H04N 5/235* (2006.01)

(52) U.S. Cl.
USPC .................................... 348/311; 348/229.1

(58) Field of Classification Search
USPC .................. 348/222.1, 311, 302, 229.1, 282;
250/208.1; 257/222, 225–234; 358/483;
377/57–63
See application file for complete search history.

(56) References Cited

U.S. PATENT DOCUMENTS

| 6,654,916 | B1 | 11/2003 | Furukawa |
| 7,485,840 | B2 | 2/2009 | Lazovsky |
| 2006/0163474 | A1 | 7/2006 | Denvir |
| 2007/0040923 | A1* | 2/2007 | Oldham ........................ 348/311 |
| 2007/0067123 | A1 | 3/2007 | Jungerman |
| 2008/0151323 | A1 | 6/2008 | Tewinkle |
| 2008/0259197 | A1* | 10/2008 | Ito et al. ........................ 348/311 |
| 2009/0009618 | A1 | 1/2009 | Hasegawa et al. |
| 2011/0007873 | A1* | 1/2011 | Rudin .............................. 378/62 |

OTHER PUBLICATIONS e2V Technologies CCD65 Series Ceramic Pack Sensor, Issue 7, Jun. 2004.*
Gach, Jean-Luc, EMCCDs & Digital CDS Techniques, ESO Conference Presentation, Dec. 17, 2003 (available at: http://www.emccd.com/downloads/pdfs/EMCCDs and Digital CDS techniques.pdf).
Mackay, Craig et al., Noise Free Detectors in the Visible and Infrared: Implications for the Design of Next-generation AO systems and Large Telescopes, Proceedings of SPIE—vol. 4840, Jan. 30, 2003, pp. 436-442.

(Continued)

*Primary Examiner* — Tuan Ho
*Assistant Examiner* — Akshay Trehan
(74) *Attorney, Agent, or Firm* — Baker Hostetler LLP

(57) ABSTRACT

An apparatus and method for low noise imaging uses an image sensor, such as an EMCCD in which charges are accumulated and shifted out using analog clock signals. A sensor controller generates the clock signals from digital waveforms stored in memory units that provide outputs to digital-to-analog converters that, in turn, convert the signals to analog form. The analog signals are then amplified and applied to the sensor. The specific waveforms are determined by a digital signal processor and stored in the memories, and the desired waveforms are read out the memories using addressing provided by a field-programmable gate array. The clock signals may be sinusoids, or may be more complex waveform shapes, and the waveform shapes may be varied by a user. The clock signal rise times may be made gradual so as to minimize noise contributions.

30 Claims, 6 Drawing Sheets

(56) References Cited

OTHER PUBLICATIONS

Basden, Alastair, et al., L3CCD's: Low Readout Noise CCD's in Astronomy, Astrophysics and Space Science Library, 2004, vol. 300, Section VIII, pp. 599-602.

Princeton Instruments, Kinetics Readout for Fast Temporal Studies, www.princetoninstruments.com, Jul. 23, 2008.

Gibson, Brad K., et al., Time-delay integration CCD read-out technique: image deformation, Mon. Not. R. astr. Soc., 1992, vol. 258, pp. 543-551.

Gach et al., "First Results of an L3CCD in Photon Counting Mode", Scientific Detectors for Astronomy Astrophysics and Space Science Library, 2004, vol. 300, Section VIII, p. 611-614.

* cited by examiner

APPARATUS AND METHOD FOR LOW NOISE IMAGING

BACKGROUND OF THE INVENTION

Low light optical detection applications require very sensitive optical detectors with relatively low noise in order to produce discernible signal outputs. In recent years, a popular type of imaging camera is based on the use of a so-called "electron multiplying charge coupled device" (EMCCD). A charge coupled device (CCD) is an analog shift register that allows electrical charges accumulated at individual locations, or pixels, in the CCD to be shifted from one charge position to an adjacent position. Such a device may be used in an optical imaging application by converting light arriving at each pixel location to photoelectrons. The accumulated electron charges at each of the pixel locations may then be "read out" of the CCD by progressive shifting from one position to the next. For a two-dimensional detector, the shifting is done in each of two perpendicular directions (referred to as "horizontal" and "vertical").

Conventional CCDs have limitations in low light situations because of the relatively high noise band of these devices. EMCCDs addressed this problem by providing an additional shift register through which the pixel charges are shifted after being shifted out of the conventional CCD structure. This additional register, referred to as a gain register, is driven by switching voltages that create a relatively high voltage drop between two register positions. This high energy transition results in impact ionization and the corresponding generation of additional electrons. Thus, the original pixel charges experience gain due to an electron multiplication effect. This gain may be adjusted by a user to a level exceeding the noise band of the detector, thus allowing the accurate detection of images in low light situations.

While EMCCDs are successful in boosting signal gain substantially for low-light optical detection, they still suffer from various noise problems. The effect of these additional noise sources limits the extreme low-light sensing capabilities of the device. Further reduction of these additional noise sources would improve performance and extend the capabilities of EMCCD based detectors.

SUMMARY OF THE INVENTION

In accordance with the present invention, an imaging apparatus is provided that uses an image sensor and corresponding sensor controller. The image sensor is of a type that has a plurality of pixels each of which accumulates an electrical charge indicative of an intensity of light incident thereupon during an image acquisition period. The accumulated electrical charges, in the form of electrons, are shiftable out of a pixel in response to at least one clock signal applied to the sensor. In an exemplary embodiment, the image sensor uses an electron-multiplying charge-coupled device (EMCCD), to which are applied multiple clock signals with the right timing to induce the shifting of the charges from one charge position to an adjacent charge position.

The sensor controller generates at least one analog clock signal that is applied to the sensor for shifting the electrical charges therethrough. The use of an analog signal allows the creation of signal shapes that avoid certain noise-producing features of the digital clock signals used to drive conventional systems, such as the high frequency components of these digital signals that tend to increase the clock-induced charge noise in the sensor. In contrast, the controller of the present invention provides a variable clock signal waveform the shape of which may be selected by a system user.

In one embodiment, the sensor controller includes a digital signal processor (DSP) used to process the desired clock signal wave shapes selected by a user. The controller may also have a memory unit in which a representation of a desired clock signal waveform may be stored and a digital-to-analog converter that receives a digital output from the memory and converts it to an analog signal. In addition, the controller may make use of a programmable logic component such as a field-programmable gate array (FPGA) that may, for example, be used to provide addressing to the memory that causes the output of the digital clock waveform.

In an exemplary embodiment, the clock signal is substantially a sinusoid, but any other shape may be selected as desired to optimize the sensor readout with regard to readout time and noise minimization. For example, one alternative embodiment provides clock signal waveforms that compensate for interphase capacitance effects between out-of-phase signals that are applied in close proximity to one another. In another embodiment, the rise time of the clock waveforms applied, respectively, to adjacent charge positions is chosen to minimize the slope of the effective potential encountered by the electrons moving from one of said charge positions to an adjacent position.

The user-variable nature of the clock signals, such as the ability to vary the signal waveform shape and/or rise time, provides a user with a high degree of flexibility in driving the image sensor. In a typical embodiment, there are multiple clock signals generated by the controller, and each clock signal may be applied to a plurality of different charge positions of the sensor so as to effect the shifting of charges through the sensor. Different regions of the sensor may also make use of different combinations of clock signals, such as a pixel region and a charge multiplication region of an EMCCD. Thus, for the generation of each different clock signal, there may be a different memory unit, DAC and amplifier combination used. A single DSP and FPGA pair may be used to synchronize all of the clock generation circuits in such a case. The DSP may also receive instructions from a host computer connected to the image sensor.

DETAILED DESCRIPTION

Figure 1:
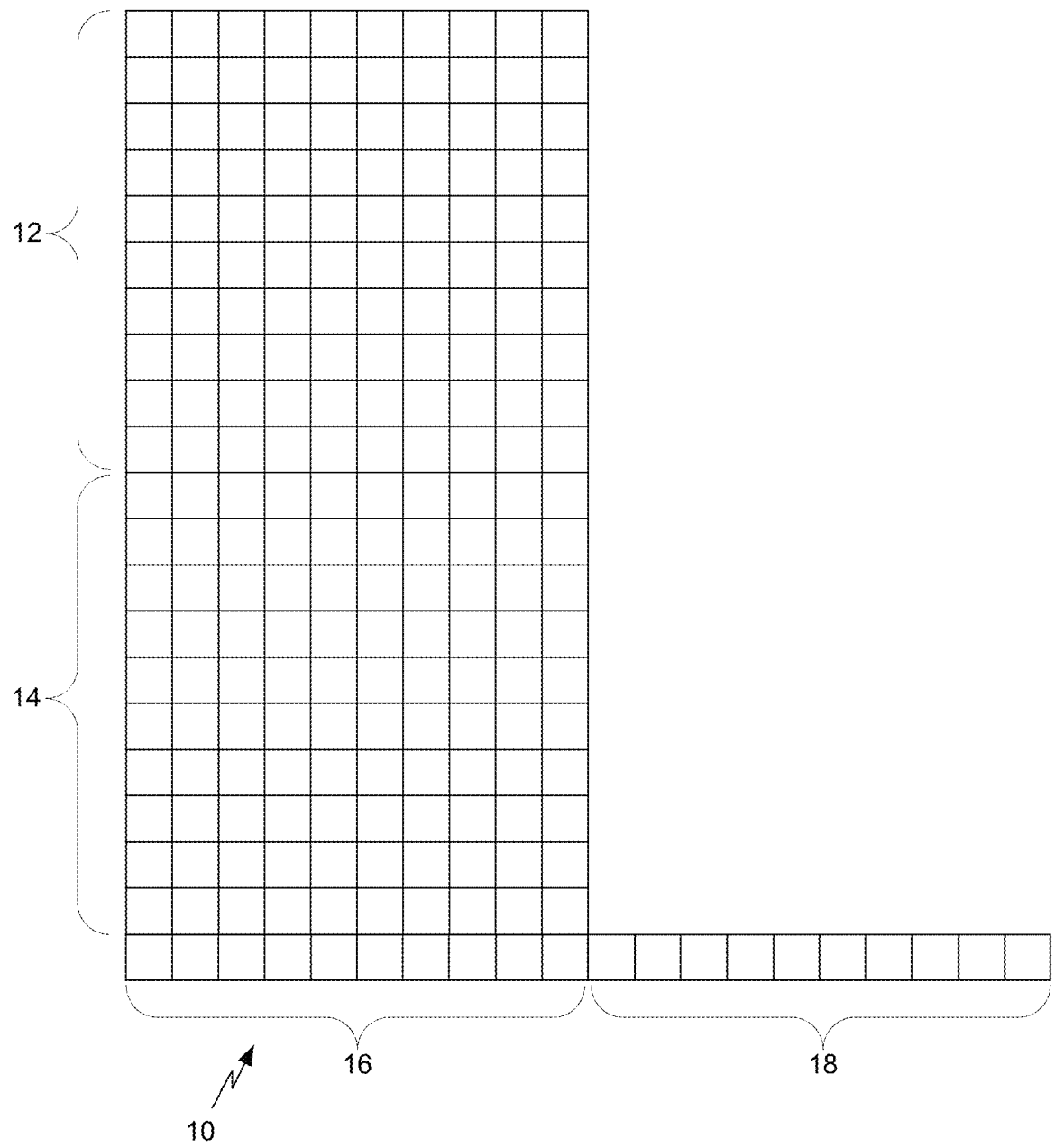
FIG. 1 is a schematic view of an EMCCD module that may be used with the present invention.

Shown in FIG. 1 is a schematic depiction of an EMCCD module 10 having two general regions, an image capture region 12 and a storage region 14. The module 10 is depicted as a grid of regions indicative of "pixels" or discrete image capture locations, although those skilled in the art will understand that the appearance of the module itself and the shape of the pixels will differ, and that the actual number of pixels used will be much higher. In addition, this is just one example of an imaging module, and other types exist that have different configurations but nonetheless function with the present invention, such as an EMCCD module having a capture region with no separate storage region. As is known in the art, the EMCCD module 10 may be used to capture an image in the region 12, each of the pixel locations accumulating photoelectrons, the total number of which is indicative of the amount of light received at that location. The image is captured during a predetermined exposure time, after which the accumulated charges (i.e., the electrons at each location) are "shifted" into the storage region 14 by moving each horizontal row of charges toward the storage region one row at a time.

The shifting of charges from the image capture region 12 to the storage region 14 is done by applying appropriate clock signals to the device that create voltage differentials between charge storage locations in the adjacent rows that induce the movement of electrons from one storage location to the next. This moves the electrons from each pixel row progressively through the EMCCD module. In this manner, the full two-dimensional array of charges in the image capture region is transferred to the storage region, thereby freeing the image capture region to collect a new image. Meanwhile, the charges in the storage region are "read out" line by line by shifting each row, one-by-one, into a serial register 16 and, for each row, shifting the charges horizontally from the serial register 16 to a gain register 18. In the gain register, the charges are amplified and eventually directed, one-by-one, to an output amplifier. It will be understood that the gain register 18 shown in FIG. 1 is a schematic representation, and that the total number of pixel positions in the gain register will be much higher.

In the gain register, the number of electrons in each pixel is multiplied by impact ionization created by using clock signals that include one signal having a relatively high voltage. The shifting of the electrons from one charge storage location to the next results from a relative voltage potential between two clock signals applied, respectively, to the two adjacent locations. When shifting a group of electrons using the high voltage clock signal at one of the locations, the corresponding high voltage differential encountered by the electrons results in the electron multiplication. Since this gain occurs prior to the relatively noisy step of converting charge to voltage (after the charges have been shifted out of the EMCCD), the effective noise contribution is comparatively low. This principle is discussed below in connection with FIG. 2.

Figure 2:
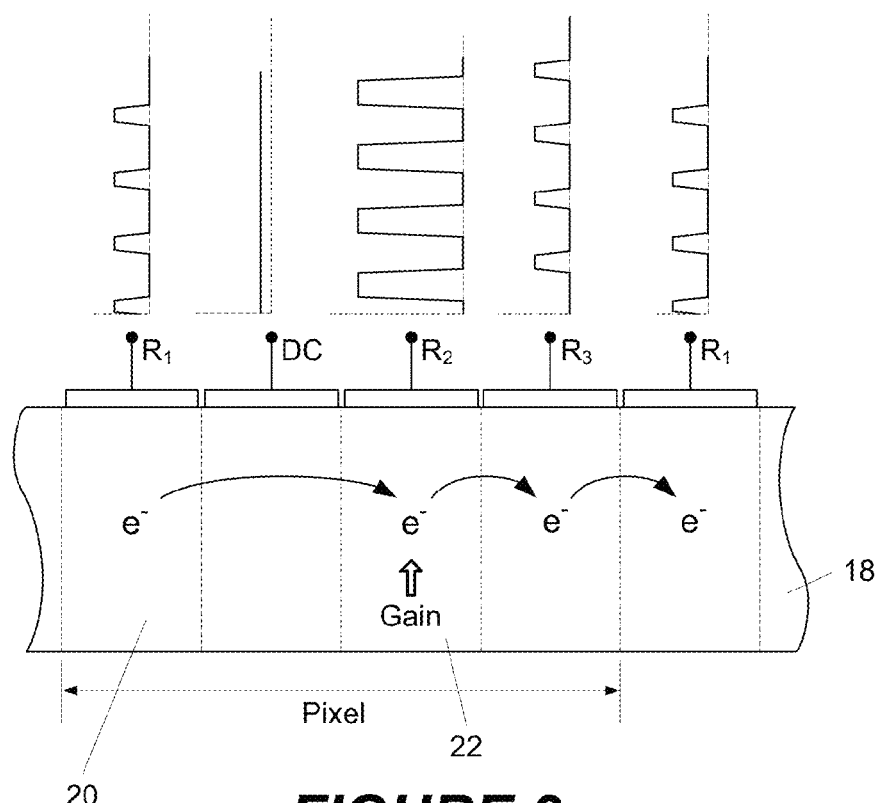
FIG. 2 is a schematic view of a gain section of an EMCCD module such as that of FIG. 1 with digital clock signals driving the section shown graphically.

FIG. 2 is a schematic representation of a portion of the gain register 18 of an EMCCD, with a graphical representation of the clock signals that are applied thereto. Those skilled in the art will understand that the waveforms shown in the figure are for descriptive purposes only, and are not precise representations of the actual signals used. The clock signals create changing relative voltage potentials that shift the electrons progressively through the gain register from one charge storage location to the next. As indicated in the figure, the range from signal input $R_1$ to input $R_3$ is representative of a "pixel" in the sense that the shifting of a charge through the gain register repeats only after passing through each of the regions adjacent to the inputs $R_1$, DC, $R_2$ and $R_3$, after which the process recommences at the location of $R_1$ of the next pixel.

The relative timing of the clock signals $R_1$, $R_2$ and $R_3$ is critical for providing a clean and efficient movement of the electrons from one position to the next In addition, the clock signal $R_2$ is provided at a relatively high voltage, as compared to the others. This high voltage creates a large voltage differential between $R_1$ and $R_2$ such that the electrons moving from position 20 to position 22 in the section of the gain register shown in FIG. 2 have a reasonable probability of impact ionization. The gain register is typically several hundred pixels long such that many such high voltage transitions occur, thereby increasing the overall gain. The use of the gain register allows the EMCCD module to achieve a much better signal-to-noise ratio for low-light imaging applications. However, prior art EMCCD systems still suffer from various noise sources which can limit the overall sensitivity in such imaging applications.

Figure 3:
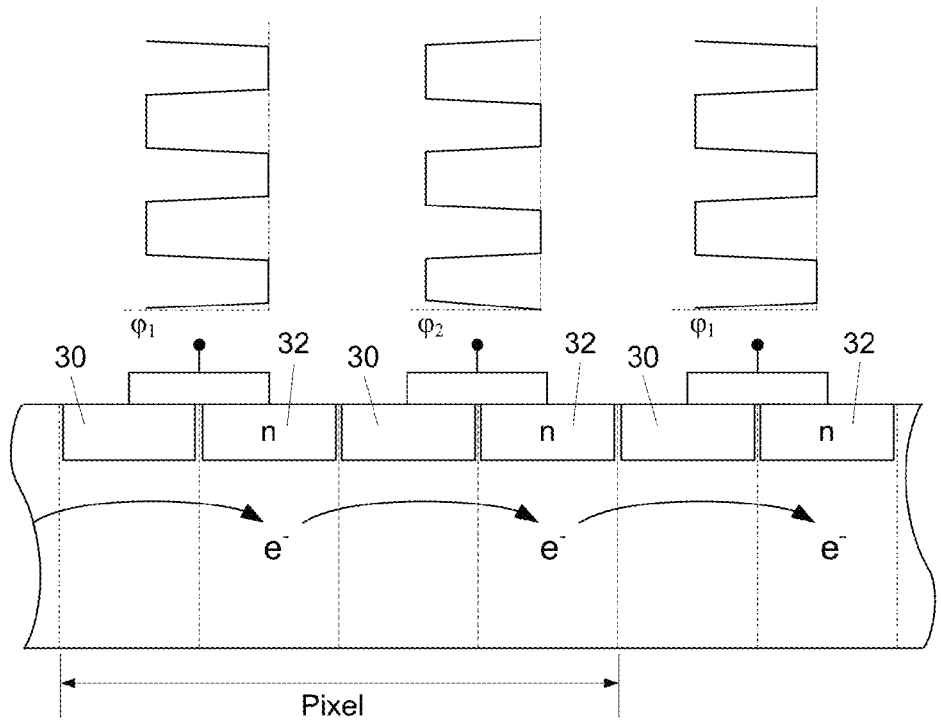
FIG. 3 is a schematic view of a non-gain section of an EMCCD module such as that of FIG. 1 with digital clock signals driving the section shown graphically.

For shifting through the non-gain portions of the EMCCD, a slightly different arrangement may be used. This applies to both horizontal and vertical charge shifting. Since there is no gain added during these shifts, it is only necessary to ensure a clean transfer from one position to the next. One example is shown in FIG. 3, which depicts schematically a two-phase CCD switching arrangement. Two phases of a single voltage signal are used in conjunction with pairs of gates to provide a regular shifting of electrons in one direction through the structure. Each pair of gates has a first gate 30 with a relatively low level of n-type doping and a second gate 32 with a higher n-type doping level. As a result, for the same voltage applied to a gate pair, the gate 32 with the higher doping level has a more positive potential, thereby creating a potential well adjacent to the gate with the lower doping level. This creates a step-type relationship between the two gates of a pair that ensures the movement of charges in a single direction.

When the two phases, $\phi_1$ and $\phi_2$, are at the same magnitude, electrons accumulate adjacent to the normal-doping level gates. As the relative magnitudes of the phases change, the potential of the second gate pair falls below that of even the higher potential gate of the first pair, and the electrons migrate to the second gate pair. Here they accumulate adjacent to the higher potential gate of the second pair and, as the phases change again, the electrons are shifted from the second gate pair to the third gate pair. The relatively higher potential gate of the second pair prevents the migration of the electrons back to the first gate pair, and ensures that the charges are shifted to the third gate pair. In this manner, the charges are shifted along from one pixel to the next.

In conventional EMCCD systems, digital clock signals are used to drive the EMCCD and the shift register. These signals are typical square waves, shaped by whatever bandwidth limitations exist in the system and by circuits that delay their rise time so as to provide a clean crossing point between two adjacent clock signals. The present invention, however, uses analog clock signals specifically constructed to minimize noise sources such as "clock-induced charge" (CIC). In particular, whereas the digital clock signals of prior art systems have sharp transitions, the clock signals of the present invention have waveforms that are specifically selected to minimize the likelihood of noise generation. In one embodiment, the clock signals are smooth wave shapes having more gradual rise times than the digital clock signals of the prior art.

In an exemplary embodiment of the invention, the EMCCD is driven by clock signals that are based on a sinusoidal shape. The application of such signals are demonstrated in FIGS. 4 and 5, which are similar to FIGS. 2 and 3 in that they depict, schematically, clock signals used for controlling an EMCCD. The use of sinusoidal signals has been found to significantly reduce the noise generated during shifting of charges through the EMCCD, both in the horizontal and vertical direction. As is discussed in more detail below, the lack of sharp transitions in the clock signal waveforms is believed to minimize the potential for electron impact ionization by avoiding sharp changes in the localized electric fields to which the shifted electrons are subjected, and a pure sinusoid clearly satisfies these criteria. However, those skilled in the art will understand that this is just an exemplary embodiment, and that any number of alternative waveforms may be used that provide improved noise characteristics.

Figure 4:
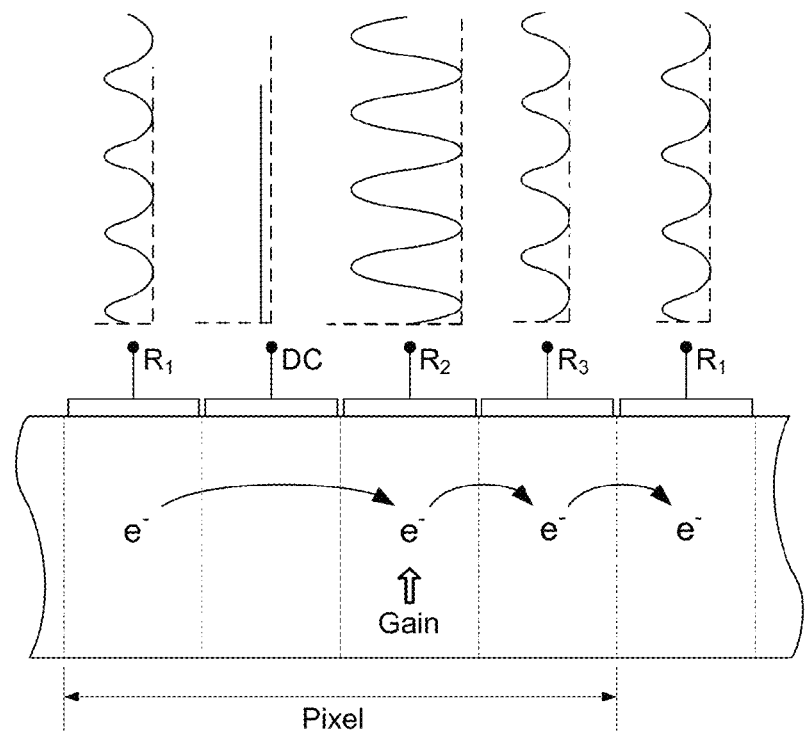
FIG. 4 is a schematic view of a gain section of an EMCCD module such as that of FIG. 1 with sinusoidal clock signals driving the section shown graphically.
Figure 5:
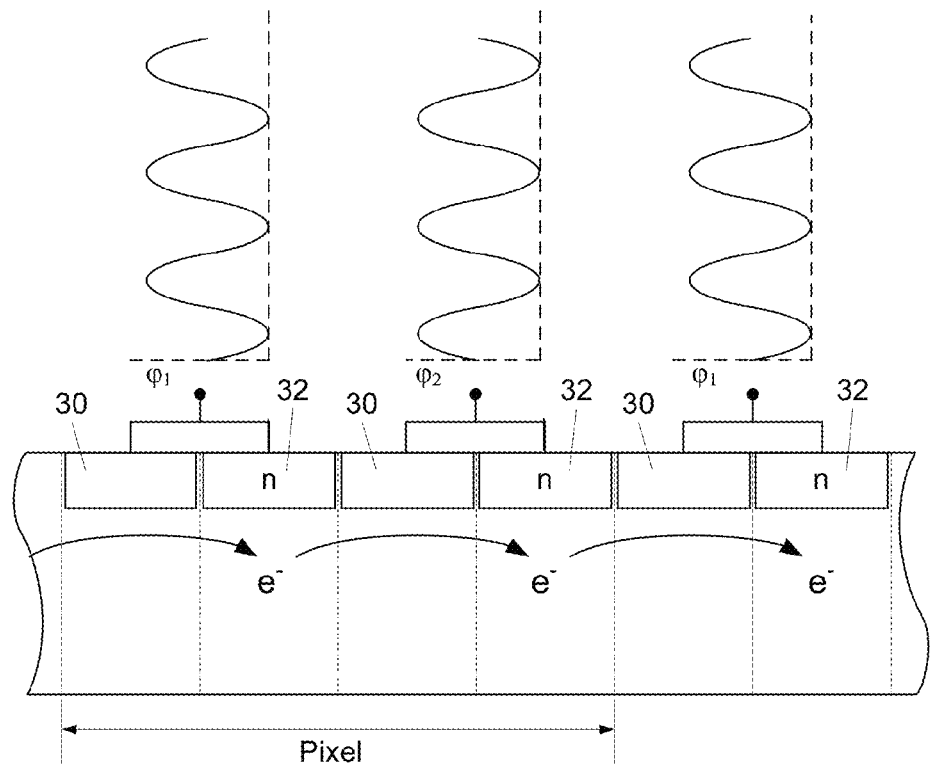
FIG. 5 is a schematic view of a non-gain section of an EMCCD module such as that of FIG. 1 with sinusoidal clock signals driving the section shown graphically.

The shifting of charges through the structures shown in FIGS. 4 and 5 is the same as described above with regard to FIGS. 2 and 3. However, the switching of the effective potential seen by the electrons is much more gradual than when using a digital clock signal, due to the smooth waveform shapes of the sinusoids. This is true for both the gain shifting portion of the module and the non-gain shifting portion. Notably, the sinusoidal waveforms also lack the wide, flat maxima of the digital signals, which may also increase the probability of noise events. Thus, the smooth, low rise time clock signals of the present invention help to limit the occurrence of noise during the shifting process.

In addition to the shape of the clock waveforms and their respective rise times, the relative interaction of the clock signals used for driving adjacent regions of the EMCCD is also believed to have an effect on noise contribution, particularly CIC noise. For example, referring again to FIG. 4, the relative state of the clock signals input at $R_1$ and $R_2$, or the relative state of the clock signals input at $R_2$ and $R_3$ has a direct impact on the CIC noise that may be accumulated by electrons or holes transitioning from one region to the next, since the electrical potential faced by the charges is determined by the relative state of both clock waveforms. The same is true for the clock signals applied to the non-gain region exemplified by FIG. 5. Thus, in selecting the clock signal waveforms, the present invention also envisions consideration of the combined effect of adjacent clock signals.

Figure 6:
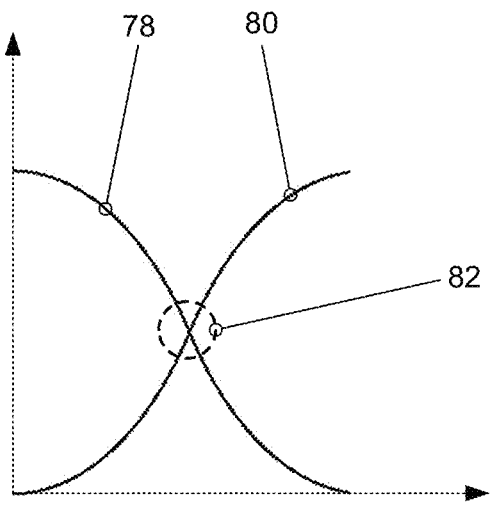
FIG. 6 is a graphical representation of a timing relationship between two sinusoidal clock signals connected to adjacent charge positions of an image sensor.

The relative effect of adjacent clock signals is discussed further with respect to FIG. 6. As is evident from the waveforms shown in FIGS. 4 and 5, the shifting of electrons through the EMCCD relies on the relative voltage levels of clock signals applied to adjacent electron transport regions. When the relative voltage difference between the two changes, the electrons move under the influence of the changing voltage bias. Thus, if a first clock signal 78 (as shown in FIG. 6) is input to a first electron region of the EMCCD, and a second clock signal 80 is input to an adjacent region of the EMCCD, electrons in the first electron region will move toward the adjacent region as the voltage level of signal 78 drops below that of signal 80. The localized electric field, however, will depend on the difference between the two signals 78, 80.

Figure 7:
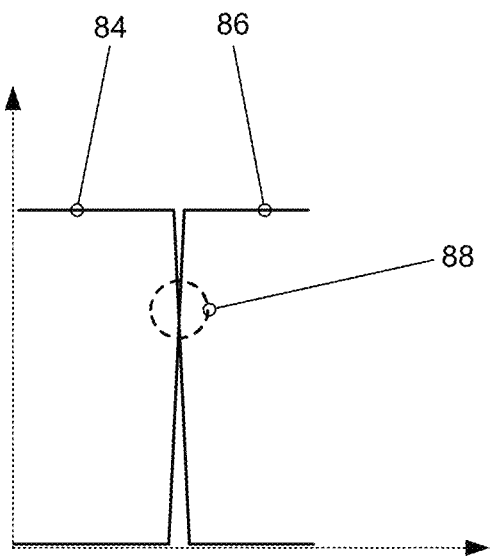
FIG. 7 is a graphic representation of a timing relationship between two digital clock signals connected to adjacent charge positions of an image sensor.

When the slopes of the cooperating clock signals are relatively low, such as with the sinusoidal signals of FIG. 6, the localized electric field potential will increase gradually relative to more conventional waveforms, such as those shown in FIG. 7. The quick transitions of the clock signals 84 and 86 and their correspondingly steep slopes at the time of electron shifting creates a much faster changing electric field. Experimentation has shown that waveforms having steep slopes such as these induce a higher degree of CIC noise than more gradual slopes such as those of the signals shown in FIG. 6. It is believed that the faster localized electric field transitions increase the probability of dislodging an electron or hole that might be weakly bound in the substrate, such as a hole resting adjacent to a semiconductor crystal defect. The dislodging of such a hole or electron, and its corresponding acceleration through the material by the local electric fields can lead to an electron impact ionization type phenomenon. Such phenomena can collectively lead to a corresponding increase the average noise level generated during readout.

Figure 8:
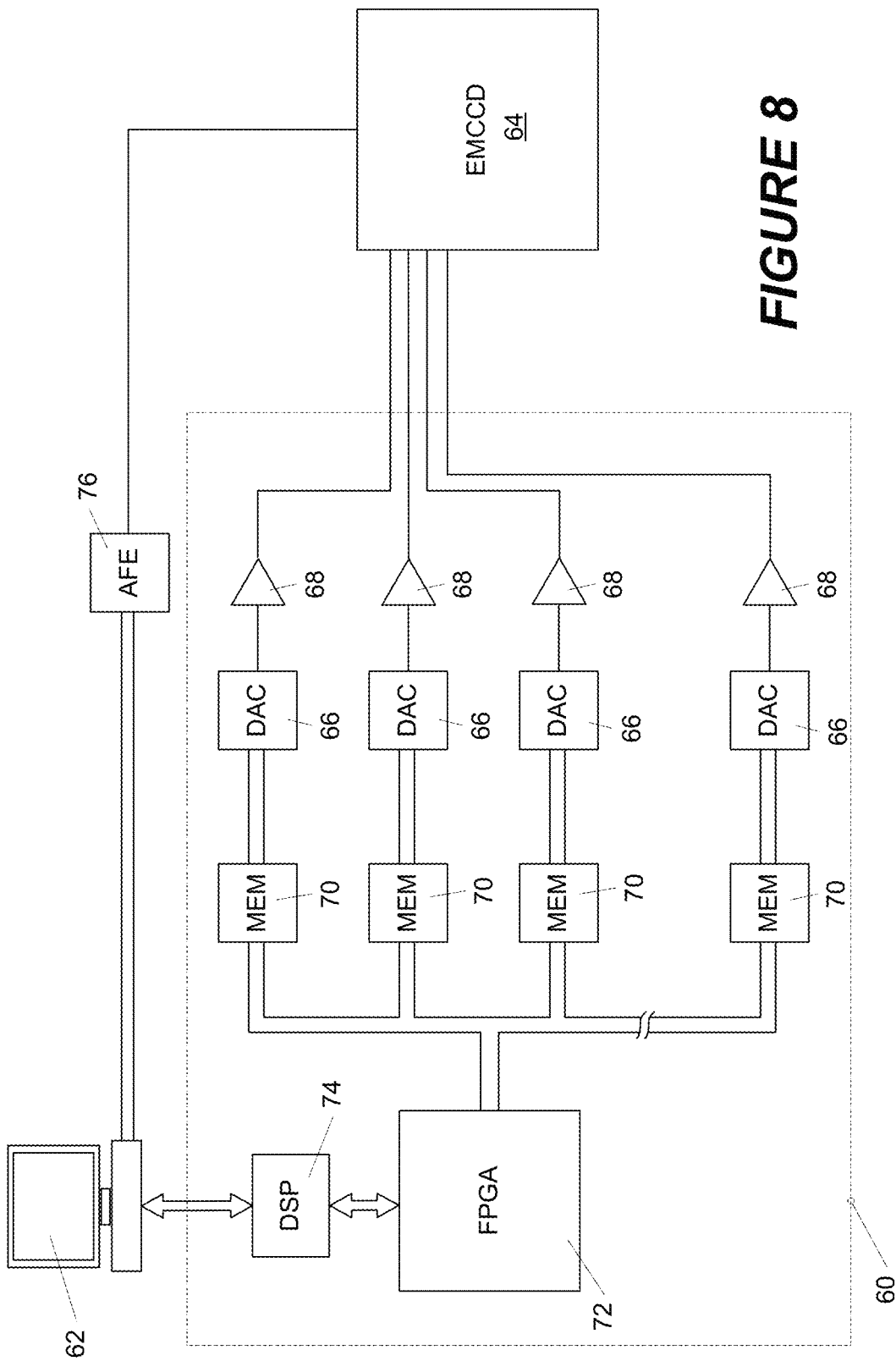
FIG. 8 is a schematic view of an image sensor controller according to the present invention connected to an EMCCD and a host computer.

To provide control of an EMCCD with the desired clock signals, the present invention provides an EMCCD controller that generates the various clock signals according to user-defined parameters. An exemplary embodiment of this controller is shown schematically in FIG. 8. As shown, the EMCCD 64 receives clock input signals from controller 60, each clock signal being generated by its own set of components within the controller. While the controller 60 generates a number of different clock signals, each produced using a similar set of components, the specific waveform of each clock signal will typically vary. Those skilled in the art will also understand that one clock signal generated by the controller may be connected to numerous input points on the EMCCD 64 associated with different EMCCD pixels.

In the present embodiment, an analog clock signal is generated using a digital-to-analog converter (DAC) 66, the output of which is amplified by an amplifier 68. The DAC in this example has a current range of zero to twenty milliamps, and a 14-bit resolution to provide 16,384 different voltage levels. Multiple DACs are used in this embodiment, and the waveform provided to each DAC 66 is stored in digital form in a memory 70, each DAC 66 having its own dedicated memory 70. The memories 70 are synchronized by field-programmable gate array (FPGA) 72 which, in turn, is driven by a digital signal processor (DSP) 74 in communication with host computer 62.

The desired clock waveforms may be selected by a user via the host computer 62, and this selection is transmitted to the DSP 74. Prior to scanning, the DSP instructs the FPGA 72 to write each desired waveform into the appropriate memory or memories 70 in digital form such that it may be output by addressing a particular range of addresses for that memory. The DSP 74 subsequently provides the FPGA 72 with the information necessary to trigger the output of each memory 70 at the appropriate times. In the present invention, the DSP 74 provides the FPGA with a starting address, an ending address and a number of repetitions for each memory 70, thus allowing the FPGA 72 to scan each memory to generate the desired clock signals.

FPGA 72 is a semiconductor device that uses programmable logic components that may be linked together to perform user-defined logic functions. Such devices are known in the art, and in the present invention are used to provide a link between the DSP 74 and the memories 70 in which the waveforms are stored. In the present embodiment, the FPGAs allow faster processing of the addressing information than the DSP is capable of, and are therefore used as intermediary components. However, if a DSP or other intelligent signal processing device was available that could provide the addresses to the memories at a fast enough rate, it could be used in place of the DSP 74 and FPGA 72 of FIG. 8.

When an image is to be taken by the EMCCD 64, the host computer 62 provides instructions to the EMCCD (as appropriate to the application) to initiate the image capture in a manner known in the art. The host computer 62 then instructs the DSP 74 to initiate a readout of the captured image, and the DSP 74 provides the address ranges to be scanned to the FPGA 72. With the desired waveforms previously stored in digital form in the memories 70, the FPGA 72 provides the addresses to the memories to effect the readout of the digitally stored waveforms at the appropriate times. The waveforms output by the memories 70 are converted into analog form by the DACs 66, and amplified by amplifiers 68 before being provided to the EMCCD 64. The clock waveforms so provided have the appropriate form and timing to shift out the pixels of the EMCCD in a manner consistent with conventional technology. However, because of the specifically defined clock waveforms of the present invention, the noise generated during the readout process is greatly reduced. The data image output from the EMCCD 64 is then processed by analog front end (AFE) 76 in a manner known in the art, before being delivered to the host computer 62.

The present invention provides an advantage over the prior art by driving an EMCCD using clock signals that are specifically selected to minimize noise generation. However, it is another aspect of the invention to provide a controller that allows the clock signal waveforms to be variable at the selection of the user. These waveforms may be selected based on particular criteria, such as the clock signal rise times, or whatever other features are beneficial to particular system conditions. For example, different imaging applications require different readout speeds from the EMCCD. Thus, while a particular clock signal waveform may be preferred for a first embodiment, an alternative embodiment that requires a faster readout speed might benefit from a modification of the clock signal waveforms, particularly the signal rise times. Moreover, different sections of an EMCCD (e.g., the gain section and the non-gain section) may make use of clock signals with different waveform shapes, all of which are generated by the controller. Having a user-variable waveform thereby provides a great deal of flexibility in how the EMCCD 64 is driven, and how noise may be minimized for different imaging applications.

Figure 9:
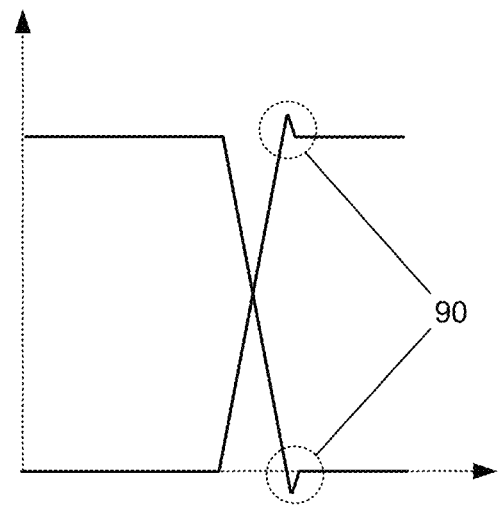
FIG. 9 is a graphical representation of an interphase capacitance effect between two clock out-of-phase signals applied in close proximity to each other.
Figure 10:
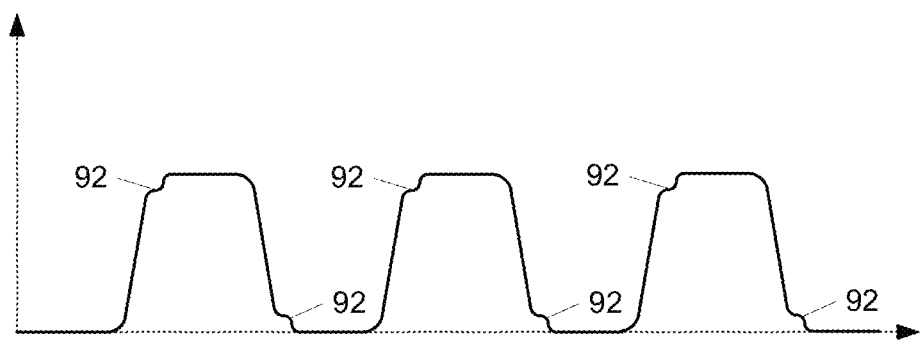
FIG. 10 is a graphical representation of a clock signal waveform that may be used to compensate for interphase capacitance effects such as those shown in FIG. 9.

Another example of the ability to select precise clock signal waveforms with the present invention is demonstrated by FIGS. 9 and 10. One of the effects of applying two alternating clock signals adjacent to each other is a certain amount of interphase capacitance between them. That is, abrupt voltage changes in one signal induce slight voltage variations in the other, due to capacitive coupling between them. In the case of two signals like those shown in FIG. 9, the coupling can manifest itself as a transient voltage spike, such as that shown at 90 in FIG. 9. Although this transient is very brief, it can have a sufficient effect on the holes and electrons in the vicinity of the clock signal to raise the probability of a CIC noise event. However, the controller of the present invention allows a user to design the shape of the clock waveforms in a way that compensates for the effects of interphase capacitance.

The waveform depicted in FIG. 10 is a typical clock signal waveform except that an additional step 92 is added to the rising and falling edges of the signal. This additional step prevents an abrupt change in the signal slope at the maximum and minimum signal voltages. Instead, the signal level tapers off before reaching the maxima/minima, and thereby softens the effect of the interphase capacitance, such that any overshoot of the signal level resulting therefrom does not significantly exceed the intended maximum or minimum signal voltage. In this way, the influence of the transient voltage spikes on surrounding holes and electrons is minimized.

While the invention has been shown and described with reference to a preferred embodiment thereof, it will be recognized by those skilled in the art that various changes in form and detail may be made herein without departing from the spirit and scope of the invention as defined by the appended claims.

What is claimed is:

1. An imaging apparatus comprising:
an image sensor having a plurality of pixels each of which accumulates an electrical charge indicative of an intensity of light incident thereupon during an image acquisition period, the electrical charge being shiftable out of a pixel in response to at least one clock signal applied to the sensor; and
a sensor controller that generates an analog clock signal having a variable waveform shape and that is input to the sensor for shifting said electrical charges, the sensor controller including a processor generating a desired clock signal waveform shape in digital form and a digital-to-analog converter converting said waveform shape into analog form.

2. An imaging apparatus according to claim 1 further comprising a user interface via which a user may vary said waveform.

3. An imaging apparatus according to claim 1 wherein the processor is a digital signal processor.

4. An imaging apparatus according to claim 1 wherein the sensor controller comprises a memory in which the desired clock signal waveform shape may be stored and wherein the digital-to-analog converter receives a digital output from the memory.

5. An imaging apparatus according to claim 4 wherein the controller further comprises a field-programmable gate array (FPGA) that provides addressing data to the memory.

6. An imaging apparatus according to claim 1 wherein the image sensor comprises a charge-coupled device.

7. An imaging apparatus according to claim 6 wherein the charge-coupled device is an electron-multiplying charge-coupled device having a gain region in which electron multiplication is used to increase charge magnitude as charges are shifted therethrough.

8. An imaging apparatus according to claim 7 wherein a first set of clock signals is applied to a pixel region of the charge-coupled device and a second set of clock signals, different than said first set, is applied to the gain region.

9. An imaging apparatus according to claim 1 wherein the clock signal is substantially a sinusoid.

10. An imaging apparatus according to claim 1 wherein the clock signal has a rise time that may be varied by a user.

11. An imaging apparatus according to claim 1 wherein the waveform shape of the clock signal compensates for interphase capacitance effects when multiple clock signals are applied in close proximity to one another.

12. An imaging apparatus according to claim 11 wherein the clock signal has a step in each of a rising and a falling edge of the signal prior to the signal reaching it respective maximum and minimum values.

13. An imaging apparatus according to claim 1 wherein the clock signal is a first clock signal that is applied to a first charge storage location of the sensor, and wherein the sensor controller generates a second clock signal different from the first clock signal and applies it to a second charge storage location of the sensor adjacent to the first charge storage location.

14. An imaging apparatus according to claim 1, wherein said waveform shape is user-selectable.

15. A controller for a charge-coupled device image sensor having a plurality of pixels each of which accumulates an electrical charge indicative of an intensity of light incident thereupon during an image acquisition period, an electrical charge being shiftable from one pixel to an adjacent pixel in response to a plurality of clock signals applied to the sensor, the controller comprising:
  a processor generating a plurality of desired clock signal waveform shapes in digital form;
  a first clock signal generation circuit having a first memory unit in which a representation of a first one of said clock signal waveform shapes is stored, a first digital-to-analog converter (DAC) that receives an output from the first memory unit and generates an output signal in analog form corresponding to the first clock signal waveform shape in response thereto and a first amplifier that amplifies the output of the first DAC and supplies it to the image sensor as a first of said clock signals; and
  a second clock generation circuit having a second memory unit in which a representation of a second one of said clock signal waveform shapes is stored, a second DAC that receives an output from the second memory unit and generates an output signal in analog form corresponding to the second clock signal waveform shape in response thereto and a second amplifier that amplifies the output of the second DAC and supplies it to the image sensor as a second of said clock signals.

16. A controller according to claim 15 wherein the processor is a digital signal processor.

17. A controller according to claim 15 further comprising a programmable logic component that receives instructions from the processor and provides addressing to the memory units that results in the generation of said memory unit outputs.

18. A controller according to claim 17 wherein the programmable logic component comprises a field-programmable gate array.

19. A method of capturing an image, the method comprising:
  providing an image sensor having a plurality of pixels each of which accumulates an electrical charge indicative of an intensity of light incident thereupon during an image acquisition period, an electrical charge being shiftable out of a pixel in response to at least one clock signal applied to the sensor;
  using a sensor controller, including a processor, generating a desired clock signal waveform shape in digital form;
  converting said waveform shape into analog form using a digital-to-analog converter, thereby generating a clock signal having a variable waveform shape; and
  applying said clock signal to the sensor for shifting said electrical charges.

20. A method according to claim 19 further comprising varying said waveform shape of the clock signal via a user interface.

21. A method according to claim 19 wherein the processor is a digital signal processor.

22. A method according to claim 19 wherein the sensor controller comprises a memory in which the desired clock signal waveform may be stored.

23. A method according to claim 19 wherein the image sensor comprises a charge-coupled device.

24. A method according to claim 23 wherein the charge-coupled device is an electron-multiplying charge-coupled device having a gain region in which electron multiplication is used to increase charge magnitude as charges are shifted therethrough, and wherein the method further comprises applying a first set of clock signals to a non-gain region of the charge-coupled device and applying a second set of clock signals, different than said first set, to the gain region.

25. A method according to claim 19 wherein generating a clock signal comprises generating a clock signal that has a substantially sinusoidal waveform.

26. A method according to claim 19 wherein generating a clock signal comprises generating a clock signal having a rise time that may be varied by a user.

27. A method according to claim 19 wherein generating a clock signal comprises generating a clock signal having a waveform shape that compensates for interphase capacitance effects when multiple clock signals are applied in close proximity to one another.

28. A method according to claim 27 wherein the clock signal has a step in each of a rising and a falling edge of the signal prior to the signal reaching it respective maximum and minimum values.

29. A method according to claim 19 wherein the clock signal is a first clock signal that is applied to a first charge storage location of the sensor, and wherein the method further comprises generating, with the sensor controller, a second clock signal different from the first clock signal and applying said second clock signal to a second charge storage location of the sensor adjacent to the first charge storage location.

30. A method according to claim 19, wherein said waveform shape is user-selectable.

* * * * *